(12) United States Patent
Edelman

(10) Patent No.: US 10,633,911 B2
(45) Date of Patent: Apr. 28, 2020

(54) OUTDOOR CHAISE LOUNGE WITH INTEGRATED LOCK-BOX AND COMMUNICATIONS SYSTEM

(71) Applicant: Loungera IP LLC, New York, NY (US)

(72) Inventor: Michael Edelman, New York, NY (US)

(73) Assignee: Loungera IP LLC, New York, NY (US)

( * ) Notice: Subject to any disclaimer, the term of this patent is extended or adjusted under 35 U.S.C. 154(b) by 0 days.

(21) Appl. No.: 15/809,983

(22) Filed: Nov. 10, 2017

(65) Prior Publication Data

US 2019/0145153 A1 May 16, 2019

(51) Int. Cl.
| | | |
|---|---|---|
| *A47C 1/14* | (2006.01) | |
| *E05G 1/00* | (2006.01) | |
| *A47C 3/04* | (2006.01) | |
| *A47C 7/62* | (2006.01) | |
| *A47C 7/40* | (2006.01) | |
| *H02S 40/38* | (2014.01) | |
| *H02J 7/00* | (2006.01) | |
| *G08B 7/06* | (2006.01) | |
| *H02S 99/00* | (2014.01) | |

(Continued)

(52) U.S. Cl.
CPC .............. *E05G 1/005* (2013.01); *A47C 1/143* (2013.01); *A47C 3/04* (2013.01); *A47C 7/40* (2013.01); *A47C 7/62* (2013.01); *A47C 7/622* (2018.08); *G08B 7/06* (2013.01); *H02J 7/0044* (2013.01); *H02S 40/38* (2014.12); *H02S 99/00* (2013.01); *A47C 7/725* (2013.01); *E05B 47/0001* (2013.01); *E05B 65/0075* (2013.01); *E05B 2047/0058* (2013.01); *E05B 2047/0095* (2013.01); *H02J 7/355* (2013.01)

(58) Field of Classification Search
CPC ....................................................... A47C 1/143
See application file for complete search history.

(56) References Cited

U.S. PATENT DOCUMENTS 1,550,055 A * 8/1925 Augustine ................ A47C 1/04
206/5
3,213,467 A * 10/1965 Hubbard .............. A61G 5/1002
297/150

(Continued)

FOREIGN PATENT DOCUMENTS

| EP | 0649968 B1 | 4/1995 |
| GB | 2432185 A | 5/2007 |
| WO | 2011163415 A2 | 12/2011 |

*Primary Examiner* — Timothy J Brindley
(74) *Attorney, Agent, or Firm* — Foley & Lardner, LLP

(57) ABSTRACT

An outdoor chaise lounge including a lock-box integrated therein. The chaise lounge may have a photovoltaic device mounted to a portion of a seat member where a user rests his or her head, and the lock-box may be positioned below a foot portion of the seat member. The foot portion of the seat member may be configured to be rotated upwards to enable a user to access the lock-box. In an embodiment, electronic devices may be integrated into a member of the chaise lounge, such as a leg member, frame member, or armrest, and be configured to enable a user to order food, beverages, attendants, or perform other communications with a billing or other system of a venue (e.g., hotel, cruise ship, etc.) via a wireless communication.

20 Claims, 15 Drawing Sheets

(51) Int. Cl.
*E05B 47/00* (2006.01)
*E05B 65/00* (2006.01)
*A47C 7/72* (2006.01)
*H02J 7/35* (2006.01)

(56) References Cited

U.S. PATENT DOCUMENTS

| | | | | |
|---|---|---|---|---|
| 3,623,683 | A * | 11/1971 | Bennett | B64D 11/00 |
| | | | | 224/275 |
| 4,850,206 | A * | 7/1989 | Larsen | F25D 17/04 |
| | | | | 62/382 |
| 4,869,449 | A | 9/1989 | Goodman | |
| 4,971,390 | A * | 11/1990 | McGinley | A47C 1/143 |
| | | | | 297/188.11 |
| 5,009,088 | A * | 4/1991 | Cislo | F41C 33/06 |
| | | | | 109/51 |
| 5,056,342 | A | 10/1991 | Prinz | |
| 5,086,755 | A * | 2/1992 | Schmid-Eilber | |
| | | | | A61H 23/0236 |
| | | | | 601/107 |
| 5,395,157 | A * | 3/1995 | Rollo | A47C 1/14 |
| | | | | 297/183.1 |
| 5,441,789 | A * | 8/1995 | Walker | A47C 1/143 |
| | | | | 297/223 |
| 5,579,909 | A | 12/1996 | Deal | |
| 5,867,873 | A * | 2/1999 | Arend | A47C 1/143 |
| | | | | 24/300 |
| 5,884,350 | A * | 3/1999 | Kurze | A61G 15/02 |
| | | | | 297/330 |
| 5,944,384 | A * | 8/1999 | Patterson | A47C 1/14 |
| | | | | 297/115 |
| 5,957,521 | A * | 9/1999 | Schlachter | B60N 2/90 |
| | | | | 296/37.15 |
| 5,975,630 | A * | 11/1999 | Schreiber | A47C 1/14 |
| | | | | 297/217.3 |
| 6,050,638 | A * | 4/2000 | West, III | A47C 7/62 |
| | | | | 297/188.09 |
| 6,085,671 | A * | 7/2000 | Kerr | E05G 1/005 |
| | | | | 109/51 |
| 6,419,313 | B1 * | 7/2002 | Newman | B60N 2/70 |
| | | | | 296/37.15 |
| 6,570,501 | B2 | 5/2003 | Bushnell et al. | |
| 7,008,013 | B2 * | 3/2006 | Okamoto | B60N 3/102 |
| | | | | 297/188.11 |
| 7,043,060 | B2 | 5/2006 | Quintana | |
| 7,249,799 | B2 * | 7/2007 | Luce | A47C 7/62 |
| | | | | 220/751 |
| 7,322,642 | B2 * | 1/2008 | BoJack | A47B 83/001 |
| | | | | 297/135 |
| 7,438,355 | B2 * | 10/2008 | Pedemonte | A47C 1/143 |
| | | | | 297/17 |
| 7,530,631 | B2 * | 5/2009 | Skelly | B60N 2/62 |
| | | | | 297/188.08 |
| 7,604,290 | B1 | 10/2009 | Giordano | |
| 7,641,279 | B1 * | 1/2010 | Curcio | A47C 1/14 |
| | | | | 297/188.18 |
| 7,780,229 | B2 * | 8/2010 | Verhee | B60R 7/043 |
| | | | | 297/188.08 |
| 7,807,923 | B2 * | 10/2010 | Moran | H02G 9/10 |
| | | | | 174/50 |
| 7,914,074 | B2 * | 3/2011 | Lindsay | B60R 7/02 |
| | | | | 296/37.15 |
| 7,963,592 | B1 * | 6/2011 | Stanley | A47C 20/026 |
| | | | | 297/188.04 |
| 8,002,349 | B1 * | 8/2011 | Pizzuto | A47C 1/143 |
| | | | | 297/184.11 |
| 8,123,291 | B1 * | 2/2012 | Hernandez | A47C 7/744 |
| | | | | 297/180.15 |
| 8,388,056 | B2 * | 3/2013 | Smith | A47C 4/286 |
| | | | | 297/16.2 |
| 8,534,753 | B1 * | 9/2013 | Perez | A47C 7/72 |
| | | | | 297/188.09 |
| 8,544,944 | B1 * | 10/2013 | Gelley | A47C 7/62 |
| | | | | 297/188.02 |
| 8,721,000 | B2 * | 5/2014 | Nguyen | A47C 7/402 |
| | | | | 297/378.1 |
| 8,789,884 | B1 | 7/2014 | Edelman et al. | |
| 8,864,221 | B1 * | 10/2014 | Delvilla | A47C 7/62 |
| | | | | 297/180.11 |
| 9,021,840 | B2 | 5/2015 | Andrews | |
| 9,307,840 | B2 * | 4/2016 | Restrepo | A47C 7/62 |
| 9,390,571 | B1 * | 7/2016 | Kupfer | A47C 7/72 |
| 9,822,578 | B2 * | 11/2017 | Peck | E05G 1/005 |
| 2002/0005649 | A1 * | 1/2002 | Hofmann | B60R 7/043 |
| | | | | 296/37.15 |
| 2003/0107247 | A1 * | 6/2003 | Wills | A47C 7/70 |
| | | | | 297/217.1 |
| 2006/0255634 | A1 * | 11/2006 | Gallo | A47C 1/143 |
| | | | | 297/220 |
| 2006/0255648 | A1 * | 11/2006 | Fleites | A47C 1/143 |
| | | | | 297/31 |
| 2008/0157571 | A1 * | 7/2008 | Richardson | A47C 4/02 |
| | | | | 297/188.1 |
| 2009/0201198 | A1 * | 8/2009 | Moudy | G06Q 10/087 |
| | | | | 342/357.75 |
| 2011/0175730 | A1 | 7/2011 | Stevenson | |
| 2011/0203328 | A1 | 8/2011 | Vilkomirski et al. | |
| 2011/0308434 | A1 * | 12/2011 | Holobinko | E05G 1/005 |
| | | | | 109/23 |
| 2012/0062175 | A1 * | 3/2012 | Miller | H02J 50/40 |
| | | | | 320/108 |
| 2012/0217710 | A1 * | 8/2012 | Houlihan | B62B 3/008 |
| | | | | 280/35 |
| 2012/0298018 | A1 * | 11/2012 | McCabe | A45C 13/20 |
| | | | | 109/51 |
| 2012/0305414 | A1 * | 12/2012 | Magnus | F25D 23/12 |
| | | | | 206/216 |
| 2013/0113259 | A1 * | 5/2013 | Wilson | A47C 7/40 |
| | | | | 297/354.1 |
| 2013/0193005 | A1 * | 8/2013 | Hoeth | G10G 7/005 |
| | | | | 206/14 |
| 2013/0278413 | A1 * | 10/2013 | Kamath | G08B 21/18 |
| | | | | 340/539.11 |
| 2014/0109631 | A1 | 4/2014 | Asquith et al. | |
| 2014/0217793 | A1 | 8/2014 | Nguyen et al. | |
| 2016/0120321 | A1 | 5/2016 | Callahan et al. | |
| 2016/0230421 | A1 | 8/2016 | Cochran | |
| 2017/0340122 | A1 * | 11/2017 | Anderson | A47C 7/66 |

* cited by examiner

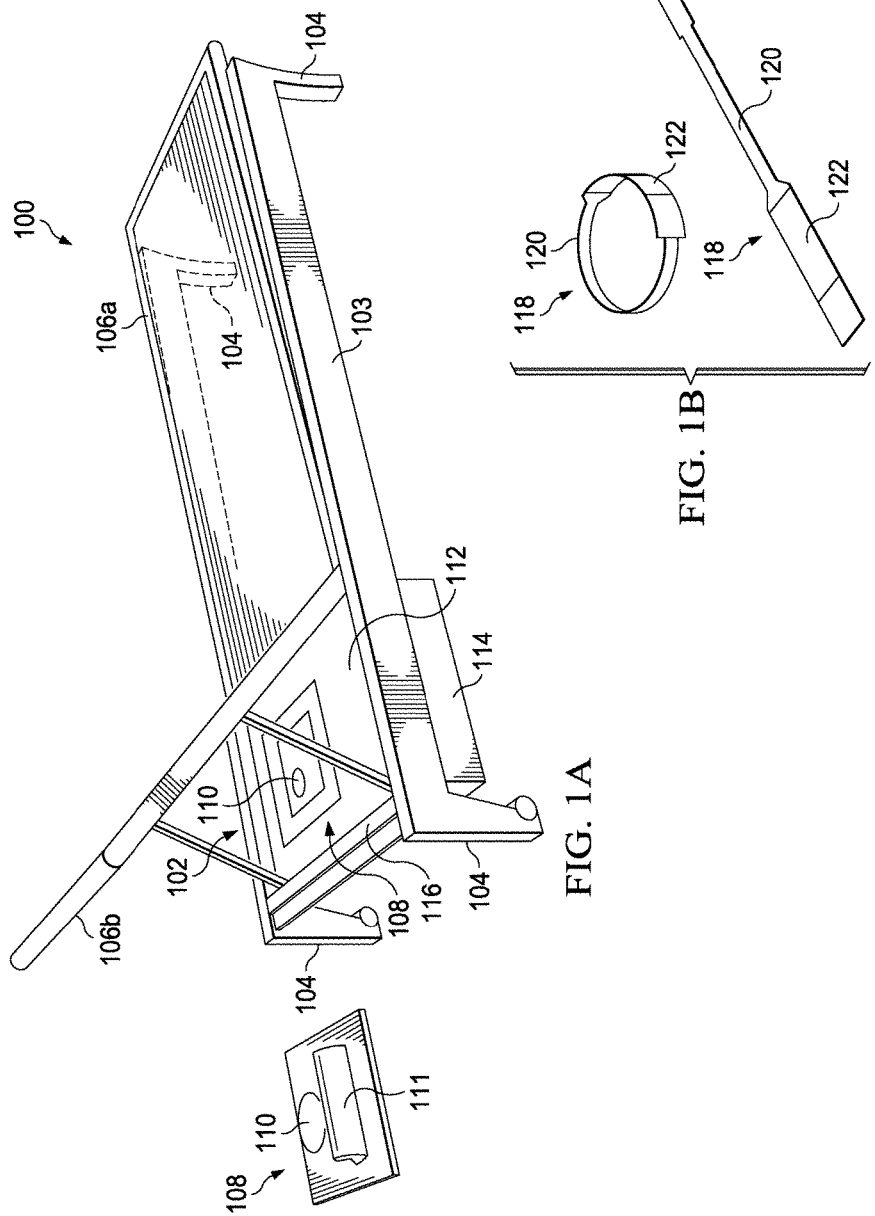

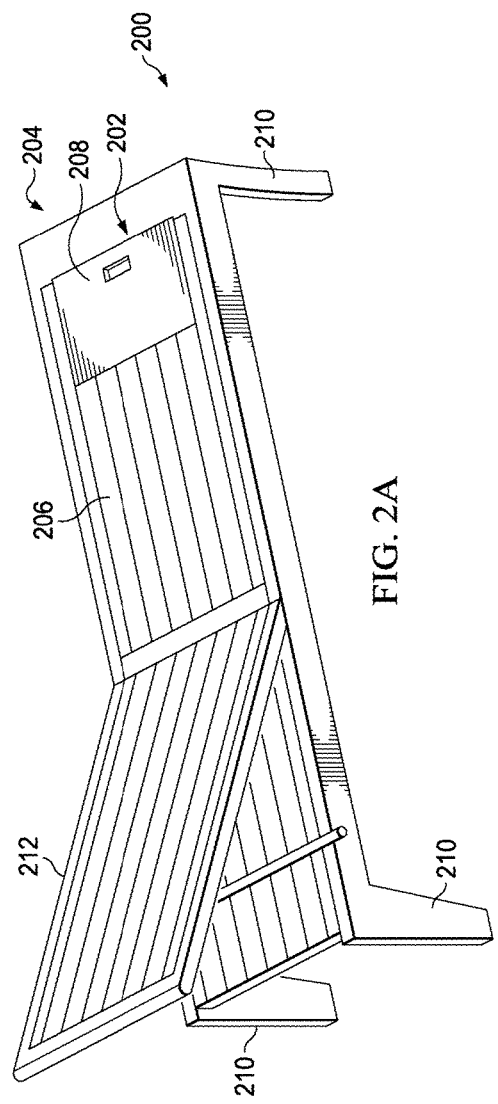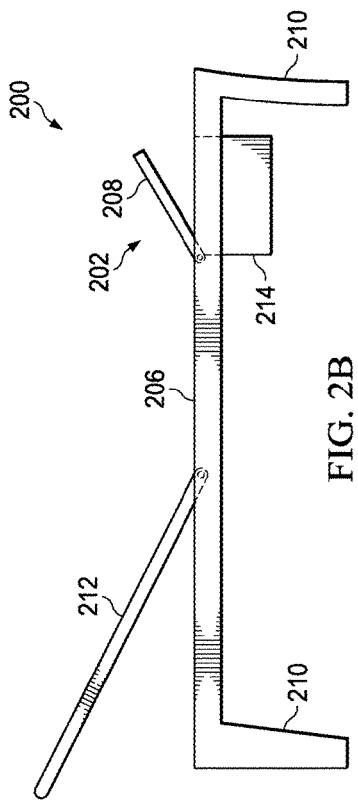

OUTDOOR CHAISE LOUNGE WITH INTEGRATED LOCK-BOX AND COMMUNICATIONS SYSTEM

FIELD OF THE INVENTION

The present invention relates to chaise lounges, and more specifically, to chaise lounges having a lock-box and communication system.

BACKGROUND

Attending pools and beaches is a favorite pastime for people around the globe. Pools, such as hotel pools, and beaches have become destination locations that often include snack bars or have food for purchase, items, such as inner-tubes, for rent or sale, or other items available for rent or purchase. To purchase or rent the food or items, people generally bring wallets and/or purses, to carry forms of payment, such as money, credit cards, or otherwise.

Mobile electronic devices, such as mobile phones, electronic games, and digital reading devices, have become prevalent throughout society. People take mobile electronic devices nearly everywhere, including pools and beaches, because mobile electronic devices provide safety, entertainment, communications, leisure reading, and other information and utility. While having valuables, such as forms of payment and mobile electronic devices, are beneficial to people at pools and beaches, it also provides an opportunity for theft by others when people leave the valuables unattended. Because of the fear of theft, people tend to leave one person with the valuables while others go swimming or elsewhere or limit their separation from the valuables (e.g., stay within eyesight of the valuables, concealing valuables with a towel or clothes, etc.) when enjoying themselves in the water, when playing on the beach, etc. As a result, the desired leisure experience tends to be limited as a result of the stress of having valuables stolen while at pools and beaches. In addition to potential theft, there is also a concern of damage to mobile devices (i) if sand or water enters the devices through a data power socket or otherwise or (ii) if the user simply drops the device on a pool deck.

SUMMARY

In order to minimize the chance of damage, loss, or theft of valuables, such as forms of payment, mobile electronic devices, or otherwise, the principles of the present invention provide for an outdoor chaise lounge that includes an integrated lock-box such that a user may lock his or her valuables in the lock-box to be secured therein. The lock-box may have a mechanical or electromechanical lock to enable a user to lock and unlock his or her valuables in the lock-box. If an electromechanical lock is used, the outdoor chaise lounge may include a photovoltaic device to convert light into electricity to charge a rechargeable battery used to power the electromechanical lock.

An outdoor chaise lounge including a lock-box integrated therein. The chaise lounge may have a photovoltaic device mounted to a portion of a seat member where a user rests his or her head, and the lock-box may be positioned below a foot portion of the seat member. The foot portion of the seat member may be configured to be rotated upwards to enable a user to access the lock-box. In an embodiment, electronic devices may be integrated into a member of the chaise lounge, such as a leg member, frame member, or armrest, and be configured to enable a user to order food, beverages, attendants, or perform other communications with a billing or other system of a venue (e.g., hotel, cruise ship, etc.) via a wireless communication.

BRIEF DESCRIPTION

The accompanying drawings, which are incorporated in and constitute a part of this specification, illustrate an implementation of the present invention and, together with the description, serve to explain the advantages and principles of the invention. In the drawings:

FIG. 1A is an illustration of an illustrative outdoor chaise lounge that has an integrated lock-box positioned beneath a backrest of the outdoor chaise lounge in accordance with the principles of the present invention;

FIG. 1B is an illustration of an illustrative RFID bracelet that may be utilized with the lock-box of FIG. 1 for unlocking an electronic lock of the lock-box;

FIGS. 2A and 2B are illustrations of an alternative illustrative outdoor chaise lounge that has an integrated lock-box that is positioned beneath a foot portion of the seat member of the outdoor chaise lounge;

DETAILED DESCRIPTION

Figure 3A:
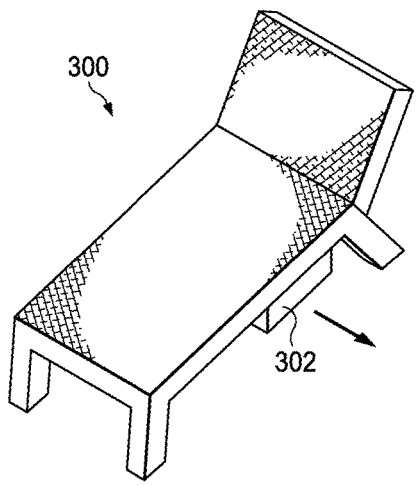
FIGS. 3A-3C are illustrations of yet another alternative illustrative outdoor chaise lounge that has an integrated lock-box that extends sideways from the outdoor chaise lounge.

With regard to FIG. 1A, an illustration of an illustrative outdoor chaise lounge 100 that has an integrated lock-box 102 supported by a frame 103 and legs 104 of the outdoor chaise lounge 100 is shown. The outdoor chaise lounge 100 may include a seat member 106a and 106b, where seat member 106b may rotate upward to operate as a backrest 106b. In this embodiment, the integrated lock-box 102 is positioned beneath the backrest 106b. The lock-box 102 may include a door 108 with a user interface 110 that enables a user to access the lock-box 102. The user interface 110 may have a wide range of configurations, including keypad, RFID scanner, wireless receiver, barcode reader, credit/debit card reader (e.g., magnetic strip reader), room key reader, electronic display, keyhole, or any other electromechanical or electronic interface that enables a user or device responsive to a user to communicate with the user interface 110 to lock and unlock the lock-box 102 so as to enable the user to add and remove personal items from the lock-box 102. In an alternative embodiment, the lock-box 102 may utilize a mechanical key and lock mechanism, as understood in the art. The door 108 of the lock-box 102 may also include a handle 111 that is integral or integrated with the door 108 to allow for the user to open and close the door 108 of the lock-box 102.

With regard to FIG. 1B, an illustration of an illustrative RFID bracelet 118 that may be utilized with the lock-box 102 of FIG. 1 for unlocking an electronic lock (not shown) of the lock-box 102 is shown. The RFID bracelet 118 may include a band 120 that is flexible and size adjustable to accommodate for adults and children. The RFID bracelet 118 may have an integrated RFID tag 122 that may be fixedly programmed with a certain code so as to be limited to a single lock-box or be reprogrammable to enable an operator or user (e.g., renter) to change the code. In one embodiment, the RFID tag 122 may be disposable. Alternatively, the RFID tag 122 may be configured to be moved from one band to another, as the RFID tag 122 may be expensive, whereas the bands may be inexpensive or have different sizes. It should be understood that any form of RFID tag may be utilized in accordance with the principles of the present invention. However, because the outdoor chaise lounges are generally used around pools or beach, the use of a bracelet may provide more convenience and safety for users than other forms or carriers in which the RFID tags may be incorporated.

With regard to FIGS. 2A and 2B, illustrations of an alternative illustrative outdoor chaise lounge 200 that has an integrated lock-box 202 that is positioned beneath a foot region 204 of a seat member 206 of the outdoor chaise lounge 200 are shown. In this embodiment, the lock-box 202 may be positioned beneath a door 208, such as a hinged door, that is integrated with the seat member 206 that enables the user to access the lock-box 202 through the seat member 206. In one embodiment, the door 208 may be configured with a user interface (not shown), as described with regard to FIG. 1A. Alternatively, the door 208 may be more of a protector cover for the lock-box 202 and be of the same or different material, such as wood or plastic, than that of the seat member 206. If the door 208 functions as a cover, than another door (not shown) for the lock-box 202 may be position beneath the door 208 and include the user interface. It should be understood that the user interface need not be a physical "touch" user interface, such as a keypad, with which a user physically touches, but may be a wireless user interface that communicates locally with an RFID tag, near field communication (NFC) interface that communicates locally with a mobile device or other item, or otherwise (e.g., remote control receiver that receives lock and unlock commands with a remote control device with which the user may use).

By having the lock-box 202 positioned at the foot region 204 of the seat member 206, in the event that the outdoor chaise lounge 200 is positioned in a tight spacing configuration with other outdoor chaise lounges, as is common at large, crowded pools and beaches, the user can access the lock-box 202 without having to walk around the outdoor chaise lounge 200 to raise a backrest member 212 of the seat member 206, as is the case with outdoor chaise lounge 100 of FIG. 1A. The lock-box 202 is shown to include a housing 214 that extends below the seat member 206 and be shorter than legs 210 of the outdoor chaise lounge 200, thereby enabling the outdoor chaise lounge 200 to be stacked with other outdoor chaise lounges (see FIG. 15).

Figure 3B:
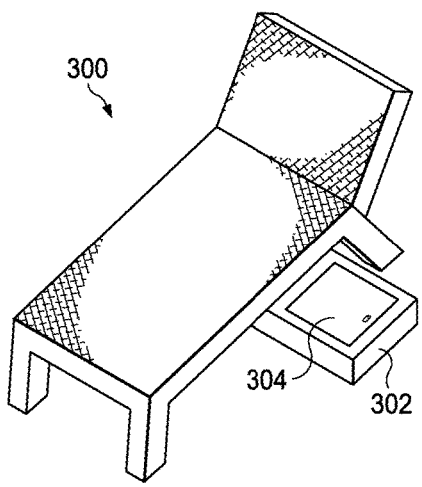
Figure 3C:
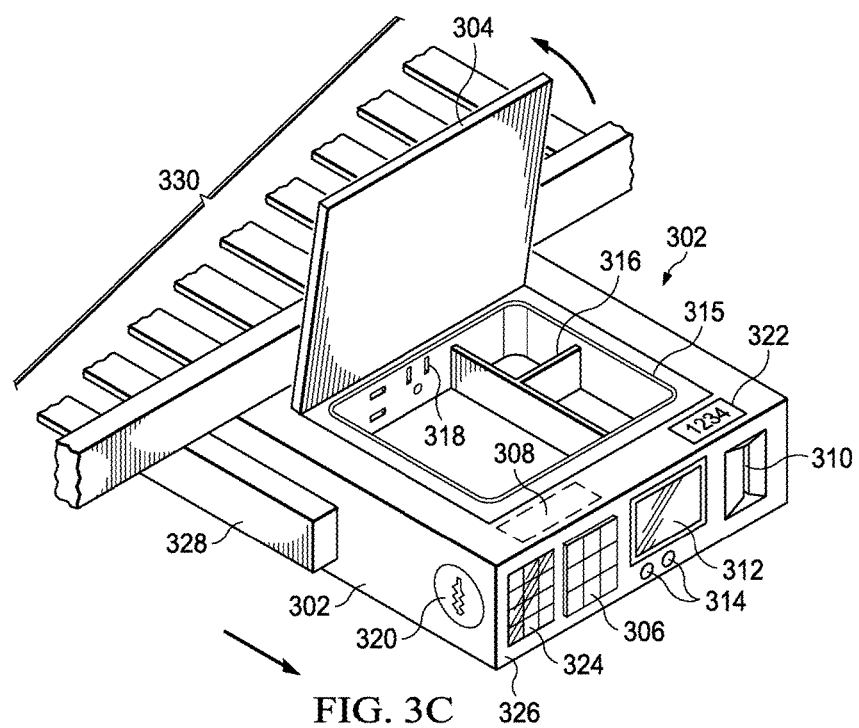

With regard to FIGS. 3A-3C, illustrations of yet another alternative illustrative outdoor chaise lounge 300 that has an integrated lock-box 302 that extends sideways from the outdoor chaise lounge 300 are shown. FIG. 3A shows the lock-box 302 in a stowed position, and FIG. 3B shows the lock-box 302 in an extended position. In the extended position, the lock-box 302 may provide a user with access to the lock-box 302, as previously described, and also provide a user with a "table" or shelf (i.e., top surface or lid 304 of the lock-box 302) on which drinks or other items may be placed. In one embodiment, sufficient hardware (e.g., slides) (not shown) may be provided to enable the lock-box 302 to be extended to either or both sides of the outdoor chaise lounge 302. In one embodiment, multiple lock-boxes may be supported by the outdoor chaise lounge, thereby enabling the user to store items in each without having to extend a larger lock-box to one side (i.e., smaller lock-boxes may be slid out on each side and/or from the foot and/or head) of the outdoor chaise lounge. In the case of a larger lock-box, rather than the door covering the entire compartment, the door may be hinged half way over the chamber, so that a portion, such as half, of the lock-box 302 may remain beneath the seat member to limit the extent that the lock-box 302 has to be extended from the outdoor chaise lounge. Having a hinged half-door may also allow a user to open the door without having to move items from the non-rotating portion of the door.

With regard to FIG. 3C, a detailed view of the lock-box 302 of FIGS. 3A and 3B is shown. The lock-box 302 is shown to include a variety of different user interface items, including a keypad 306, antenna(s) 308 for receiving wireless communications, credit card reader 310, touch screen display 312, and/or other user interface component(s), such as status indicator(s) 314. In one embodiment, a coin and/or bill reader (not shown) may be included at the outdoor chaise lounge 300 to rent the lock-box 302. The lid or door 304 may be pivotally configured with the lock-box 302, and be inclusive of a seal 315 either on the door or along an interface with which the door 304 contacts when closed to prevent water from entering a compartment of the lock-box 302. Moreover, the compartment may be sub-divided with divider(s) 316 and be padded with a soft material (e.g., felt) to limit damaging items that are stored therein. Outlets, charging ports, input/output (I/O) ports or other ports 318 that a user may desire to use to charge or access content via a network, such as the Internet, may be provided within the lock-box 302.

A variety of different configurations to provide the user with access to the various ports, such as through a front or side internal or external wall of the lock-box 302 may be provided in accordance with the principles of the present invention. Such access to the ports 318 may be restricted to a user who rents the lock-box 302 or any user of the outdoor chaise lounge 300. A master key slot 320 may provide for an operator to override any electronic control of the lock-box 302. A master passcode or PIN may also be available to an operator to access the lock-box 302. The lock-box 302 may also have an identifier, serial number, other printed indicia 322 to allow a user and operator to know which lock-box is positioned on an outdoor chaise lounge 300. In one embodiment, a solar panel 324 positioned on a front face 326 of the lock-box 302. Mounting hardware 328 that enables the lock-box 302 to slide in and out from beneath a seat portion (chair deck and rails) 330 may be utilized.

Figure 4:
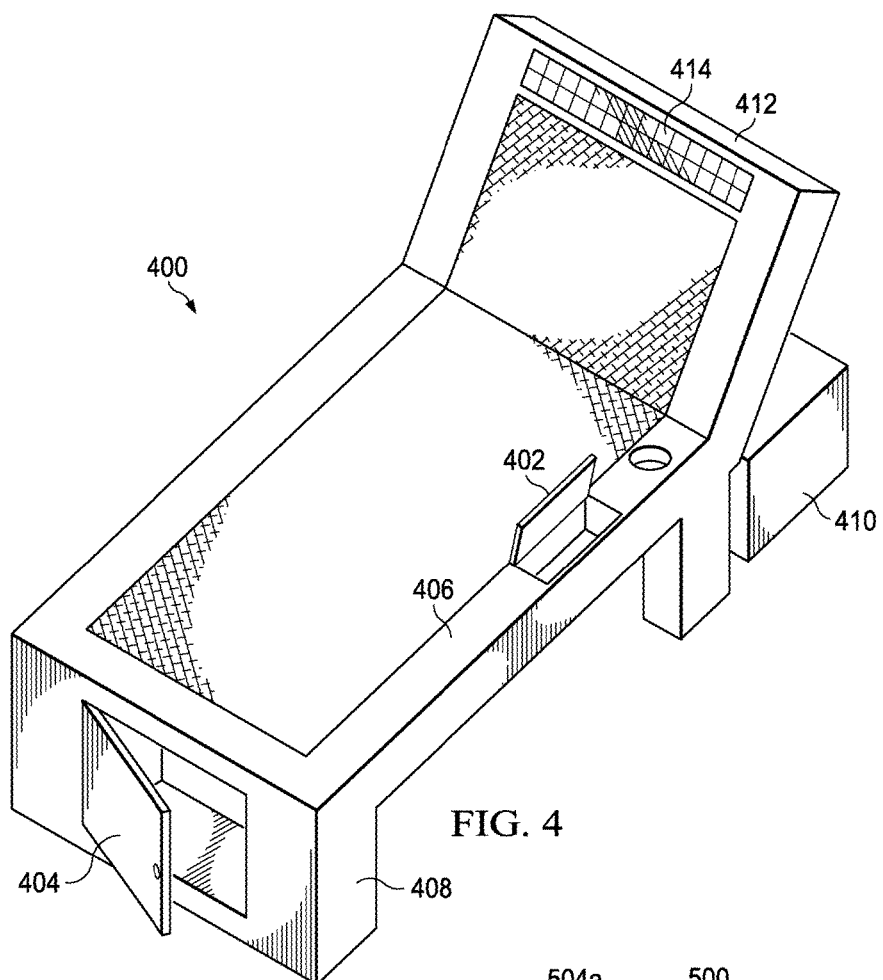
FIG. 4 is an illustration of an illustrative outdoor chaise lounge that has integrated lock-boxes in an armrest and a leg at a foot region of the outdoor chaise lounge in accordance with the principles of the present invention.

With regard to FIG. 4, an illustration of an illustrative outdoor chaise lounge 400 that has integrated lock-boxes 402 and 404 respectively positioned in an armrest 406 and leg 408 at a foot region of the outdoor chaise lounge 400 in accordance with the principles of the present invention is shown. A lock-box 410 may also be positioned beneath a headrest 412 of the outdoor chaise lounge 400. It should be understood that multiple lock-boxes are optional and that more than two lock-boxes may be integrated with the outdoor chaise lounge 400. As further shown, a solar panel 414 may be positioned along a top portion of the back rest 412 of the outdoor chaise lounge 400 and integrated therein. The solar panel 414 may alternatively be retrofitted onto an existing outdoor chaise lounge. Because the lock-box(es) 402, 404, and 410 may use electricity for powering electronics configured to provide for functionality (e.g., lock and unlock), the solar panel 414 may be used to power and/or recharge one or more rechargeable batteries (not shown) mounted to or integrated with the outdoor chaise lounge 400 or lock-box(es) 402, 404, and/or 410. And, because the outdoor chaise lounge 400 has the availability of electricity, additional features may be provided with the outdoor chaise lounge 400, including:

(i) a pager interface (not shown) for notifying an attendant to visit the user at the outdoor chaise lounge;
(ii) an alarm (not shown) to alert a lifeguard or attendant of an incident, such as a drowning victim;
(iii) a fan (not shown) for cooling down a person;
(iv) a mister (not shown) for use in providing water mist to the user;
(v) a charger (not shown) for charging a mobile device, such as a mobile telephone, which may be inside the lock-box;
(vi) a media device (not shown), such as a radio, television, CD player, electronic display, speakers with Bluetooth® interface (all not shown);
(vii) a display (not shown) that provides for status of lock-box 402, enables a user to create a personal identification number (PIN) or passcode, input a passcode, open lock of the lock-box, or otherwise (e.g., usage status of the outdoor chaise lounge 400);
(viii) a light (not shown) positioned on the outdoor chaise lounge 400 or extending vertically from the outdoor chaise lounge 400 on an extension arm (not shown) to notify an attendant that attention is desired; or
(ix) any other device that may use electricity that is capable of being powered by a rechargeable battery by the solar panel 414.

It should be understood that the solar panel 414 may be configured in a variety of ways with the outdoor chaise lounge 400 or that an external solar panel that is not integrated with the outdoor chaise lounge 400 (e.g., integrated with a nearby table or umbrella) may be plugged into an outlet (not shown) on the outdoor chaise lounge 400 for recharging a rechargeable battery (not shown) that is integrated with the lock-box 402 or outdoor chaise lounge 400.

Figure 5:
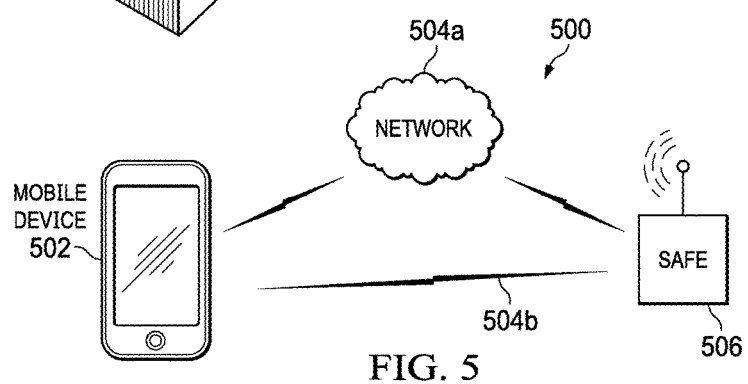
FIG. 5 is an illustration of an illustrative network environment in which a mobile device may be configured to communicate with a safe or lock-box positioned at an outdoor chaise lounge to lock and/or unlock the lock-box.

With regard to FIG. 5, an illustration of an illustrative network environment 500 in which a mobile device 502 may be configured to wirelessly communicate via a communications network 504a and/or 504b (e.g., mobile communications network, WiFi, NFC, Bluetooth, Infrared, local area network (LAN), wide area network (WAN), or otherwise) with a safe or lock-box 506 positioned at an outdoor chaise lounge, such as outdoor chaise lounge 300 of FIG. 3, to lock and/or unlock the lock-box 506 is shown. It should be understood that a variety of different mechanisms, techniques, and communications protocols, for communicating with a user interface and/or looking mechanism of a lock-box are contemplated.

Figure 6:
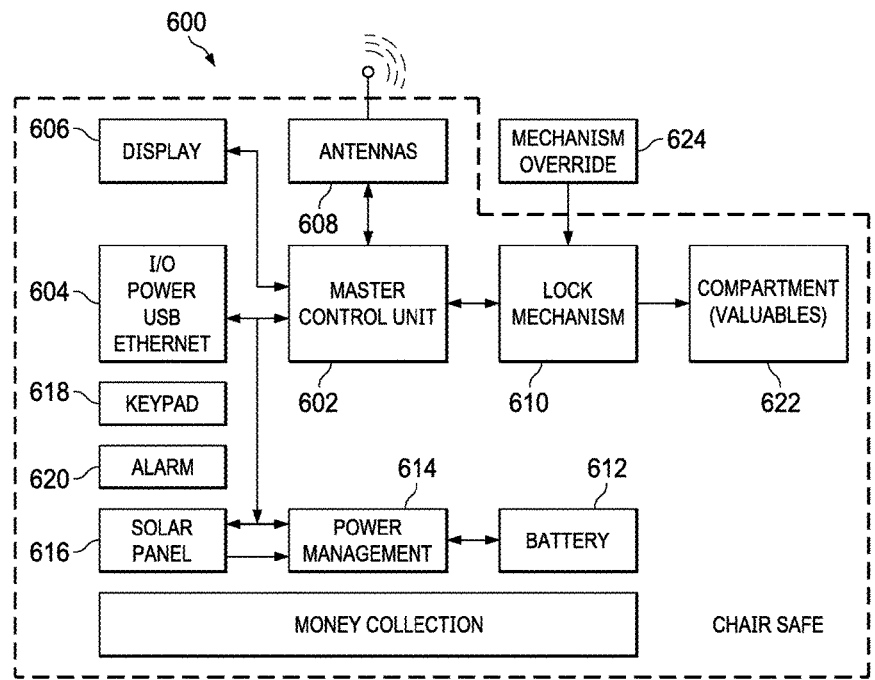
FIG. 6 is a block diagram of illustrative circuitry for use in controlling and operating a lock-box positioned at an outdoor chaise lounge.

With regard to FIG. 6, a block diagram of illustrative circuitry 600 for use in controlling and operating a lock-box positioned at an outdoor chaise lounge is provided. The circuitry 600 may be formed of multiple modules, including master control unit 602, I/O circuitry 604, electronic display 606, antenna(s) 608 for communicating over one or more different frequency bands and using one or more different communications protocols, locking mechanism 610, battery and/or rechargeable battery 612, power management module 614, solar panel(s) 616, keypad 618, alarm (e.g., speaker) 620, and so on. The master control unit 602 may execute software to manage operations of the circuitry for communicating with and operating the locking mechanism 610 to control access to a compartment 622 of the lock-box. Power and databus outlets (not shown) may also be provided by the circuitry 600. An override mechanism 624 that may be electrical (e.g., circuitry and/or software) or mechanical (e.g., physical key/lock) that may be used as a master override may be utilized to open the lock mechanism 610.

Figure 7:
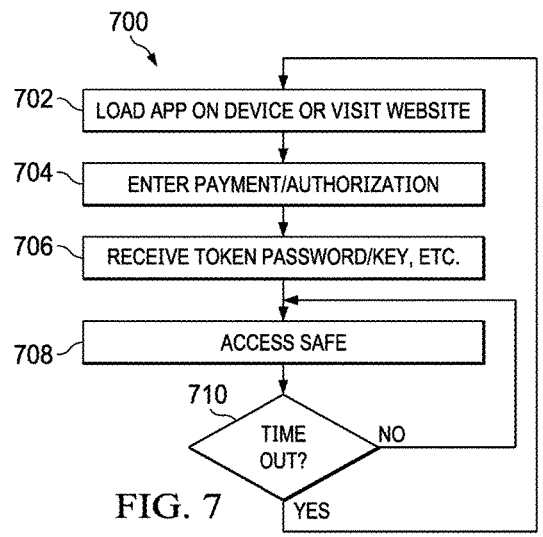
FIG. 7 is a flow diagram of an illustrative process for renting and operating a lock-box at an outdoor chaise lounge.

With regard to FIG. 7, a flow diagram of an illustrative process 700 for using an app on a mobile device for renting and operating a lock-box at an outdoor chaise lounge is shown. The process 700 may start at step 702 for loading an app on a mobile device or accessing a website. Payment/authorization may be received from the app or website to enable a lock-box to be rented at step 704. In one embodiment, an identifier of the particular lock-box may be given. The identifier may be associated with a particular network address that is unique to a lock-box, thereby enabling remotely controlling the lock-box via a communications network. A token, password, key, or other identifier may be generated by a computing device or received from the user, or simply communicated to the lock-box at step 706. At step 708, to unlock the lock-box, the user may enter a passcode or PIN (supplied by the user via the app or website) into a user interface. Alternatively, the lock-box may be controlled remotely via a remote server or other communications device or system, such as a kiosk or operator station. At step 710, a time duration (e.g., 4 hours) for rental or use of the lock-box may be monitored and, if time runs out, then the process may restart at step 702. Otherwise, the user may continue to access (i.e., lock and unlock) the lock-box. The user may also actively terminate using the lock-box, and the process 700 is restarted in response thereto. An information management system managed and/or operated by an operator or owner of the outdoor chaise lounges may be utilized to store information being used to control and operate the lock-boxes associated with the outdoor chaise lounges.

Figure 8:
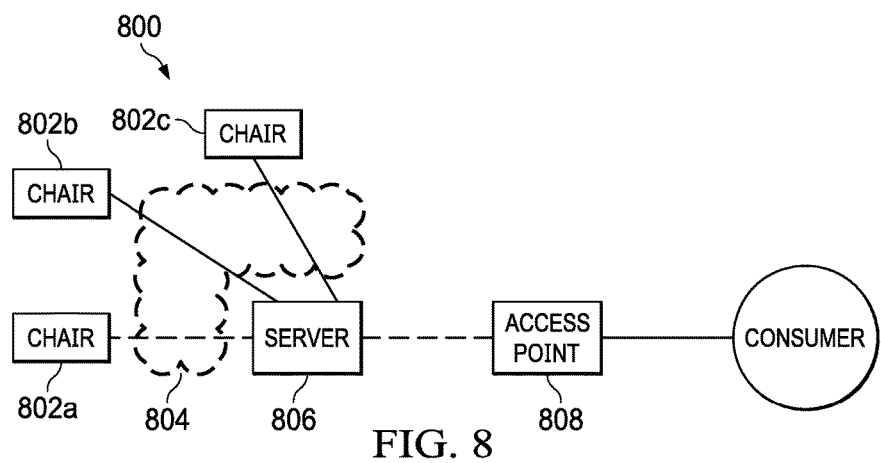
FIG. 8 is a block diagram of an illustrative network environment in which a user may rent a lock-box at an outdoor chaise lounge.

With regard to FIG. 8, a block diagram of an illustrative network environment in which a user may rent a lock-box at an outdoor chaise lounge from among multiple outdoor chaise lounges 802a-802c (collectively 802) is shown. In the network environment 800 shown, a local area network 804 may be utilized. The local area network 804 may be a WiFi network or any other LAN configuration or protocol, as understood in the art, where each of the outdoor chaise lounges with lock-boxes may have a different network address, as understood in the art. An access point 806, server 808, and other network devices may be provided to support communications to and from the lock-boxes. If the outdoor chaise lounges 802 are at a hotel, resort, cruise ship, or otherwise, then the user may access the lock-boxes via a hospitality management system via a hotel television system, telephone system, intranet, or any other system offered by the hotel, resort, cruise ship, or otherwise. The access point 808 may be a kiosk, vending machine, web portal, smartphone app, and/or hospitality management system.

Figure 9:
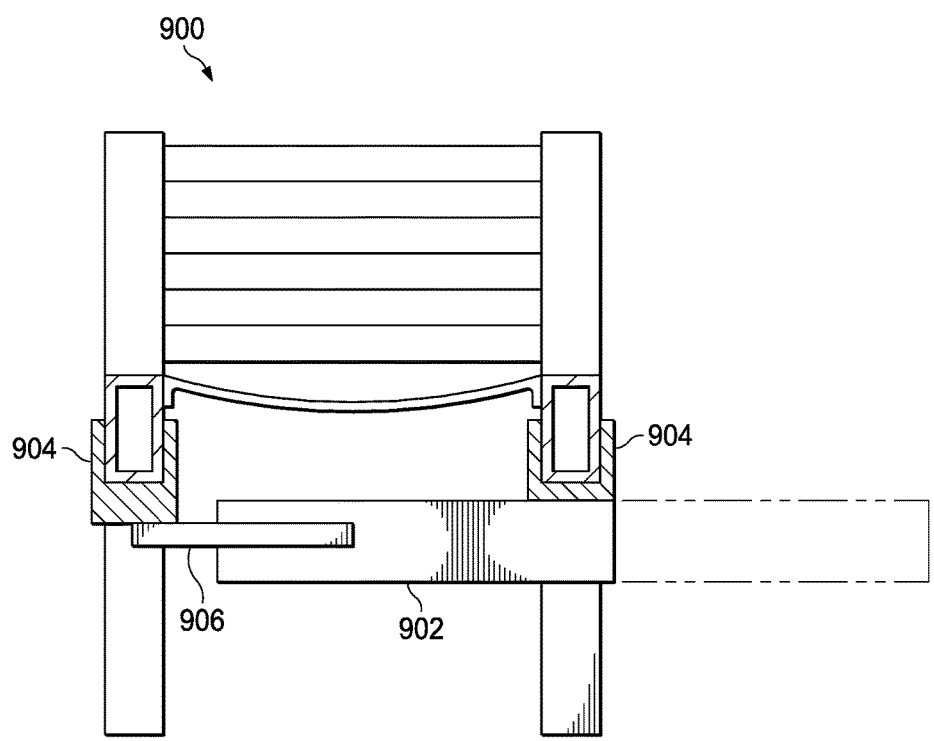
FIG. 9 is an illustration of an illustrative outdoor chaise lounge that has been retrofitted with a lock-box.

With regard to FIG. 9, an illustration of an illustrative outdoor chaise lounge 900 that has been retrofitted with a lock-box 902 is shown. In this embodiment, a lock-box may be retrofitted into an existing outdoor chaise lounge by adding brackets 904 that support the lock-box. In addition to the brackets 904, other hardware, such as sliders 906, hinges (not shown), and/or other members (e.g., fastening members) may be used to support the lock-box 902. By retrofitting the lock-box 902 onto an existing outdoor chaise lounge 900, an owner of outdoor chaise lounges may simply purchase, rent, or otherwise acquire the lock-boxes and supporting communications equipment without having to purchase new outdoor chaise lounges or have an operator of the lock-boxes have to provide new outdoor chaise lounges in the case where the operator of the lock-boxes offers new outdoor chaise lounges with integrated lock-boxes with a revenue sharing arrangement, for example. In retrofitting the outdoor chaise lounge 900, fastening members that are atypical, non-standard, or configured in a manner (e.g., overlapping retrofitting elements) to be difficult to remove may be utilized to reduce the potential for the lock-boxes to be removed by someone other than authorized personnel. To further secure a lock-box, such as lock-box 114 (FIG. 1) or lock-box 902, to an outdoor chaise lounge, such as outdoor chaise lounges 100 (FIG. 1) and 900, the lock-box may be fixedly attached to a frame member of a frame, such as frame 103 (FIG. 1). In one embodiment, the frame may be formed of multiple frame elements. One or more brackets (e.g., brackets 904) may be configured to be connected between the multiple frame elements, thereby fixedly securing the lock-box 902 to the frame and preventing the lock-box from being removed from the frame without separating the multiple frame members. Additionally and/or alternatively, a bracket may be configured to mount the lock-box to the frame, and fastening members may be configured to fixedly secure the lock-box to the frame. A cover member may be configured to prevent direct access to the fastening members, where the cover member includes at least one cover fastening member being different from the fastening members.

Figure 10:
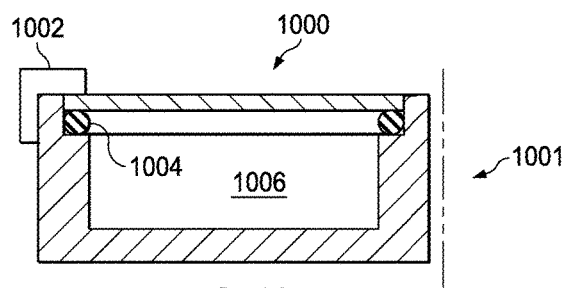
FIG. 10 is an illustration of a cutout view of an illustrative lock-box that is weather proof for use with outdoor chaise lounges.

With regard to FIG. 10, an illustration of a cutout view of an illustrative lock-box 1000 that is weather proof for use with an outdoor chaise lounge 1001 is shown. A locking mechanism 1002 may be included, where an elastomeric seal 1004 surrounding a region at which a lid or door of the lock-box 1000 may be included to protect a compartment 1006 of the lock-box 1000 in which items may be stored.

Figure 11:
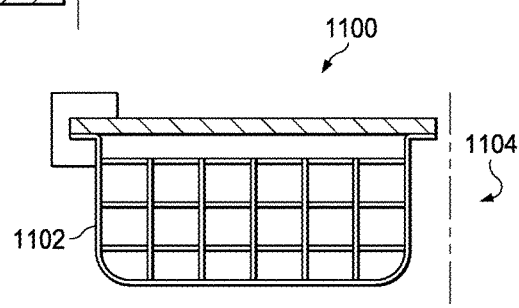
FIG. 11 is an illustration of a rear view of an illustrative lock-box having a wire basket for use with outdoor chaise lounges.

With regard to FIG. 11, an illustration of a rear view of an illustrative lock-box 1100 having a wire basket 1102 for use with an outdoor chaise lounge 1104 is shown. The use of the wire basket 1102 is not weather proof, but simply provides for a secured holder of personal items. In one embodiment, a cover may be formed of a solid material, such as plastic or wood, that prevents rain and sun from directly entering the wire basket. Because the cover will be subjected to sunlight and weather conditions, the cover may be formed of a material that is capable of surviving long periods of time in sunlight and can withstand wide temperature and moisture conditions for longer use without having to be replaced.

Figure 12:
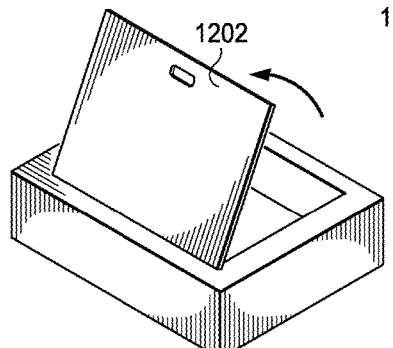
FIG. 12 is an illustration of an illustrative lock-box configured with a hinged lid door.

With regard to FIG. 12, an illustration of an illustrative lock-box 1200 configured with a hinged lid door 1202 is shown. Such a configuration may be used with certain configurations and positions of lock-boxes, such as those described hereinabove. In one embodiment, the door 1202 may be biased to a closed position using a spring (not shown) or other design mechanism, so that the door will close automatically unless being physically held open by a user, thereby reducing the chance that rain or other water will enter the compartment. Other covers or enclosure mechanisms may use the same or similar close-position bias design function.

Figure 13:
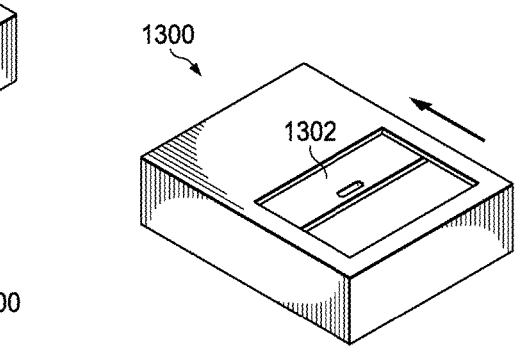
FIG. 13 is an illustration of an illustrative lock-box configured with sliding lid door.

With regard to FIG. 13, an illustration of an illustrative lock-box 1300 configured with a sliding lid door 1302 is shown. The use of the sliding door 1302 enables the lock-box 1300 not to be fully slid out from beneath an outdoor chaise lounge to access a compartment of the lock-box.

Figure 14:
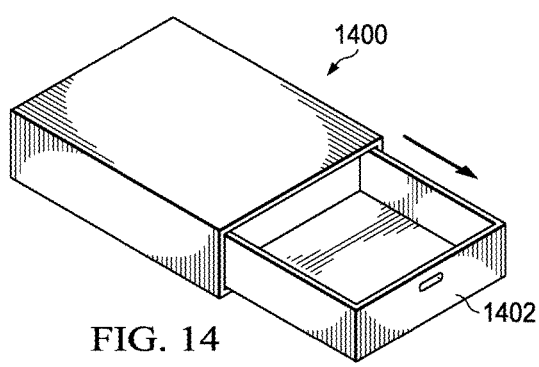
FIG. 14 is an illustration of an illustrative lock-box configured with a sliding drawer.

With regard to FIG. 14, an illustration of an illustrative lock-box 1400 configured with a sliding drawer 1402 is shown. The sliding drawer 1402 may be used to reduce the amount of hardware that would otherwise have to support movement of the entire lock-box 1400.

Figure 15:
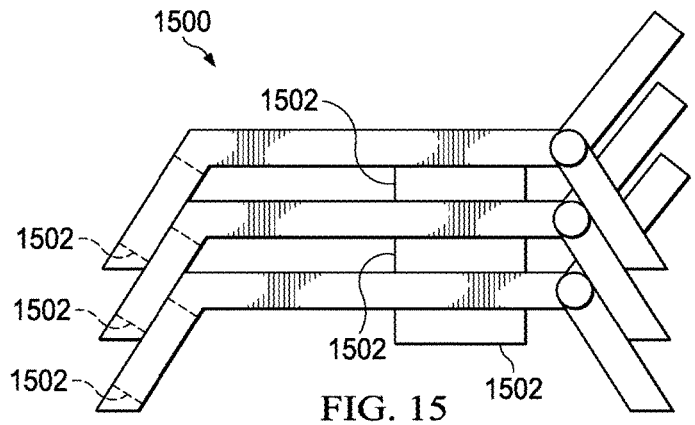
FIG. 15 is an illustration of illustrative outdoor chaise lounges, configured with one or more lock-boxes, in a stacked configuration.

With regard to FIG. 15, an illustration of illustrative outdoor chaise lounges 1500, configured with one or more lock-boxes 1502, in a stacked configuration is shown. Because of the configurations and positions of the various lock-boxes or safes 1502, the outdoor chaise lounges are able to be stacked as is normally done. In one embodiment, the lock-boxes 1502 may be centrally positioned with respect to the outdoor chaise lounges (i.e., centered horizontally and longitudinally), thereby making moving and lifting the outdoor chaise lounges more balanced for attendants and users of the outdoor chaise lounges.

Figure 16A:
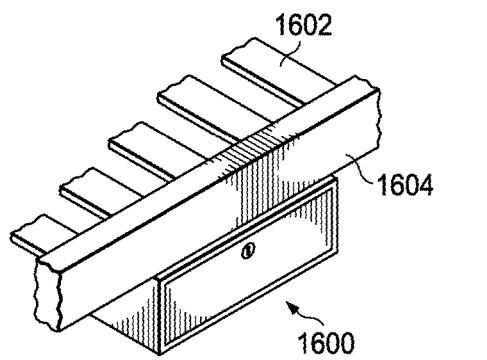
FIGS. 16A-16C are illustrations of an illustrative sliding lock-box in three different positions that may be integrated with an outdoor chaise lounge.
Figure 16B:
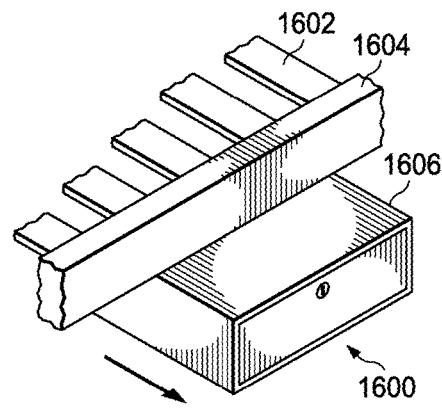
Figure 16C:
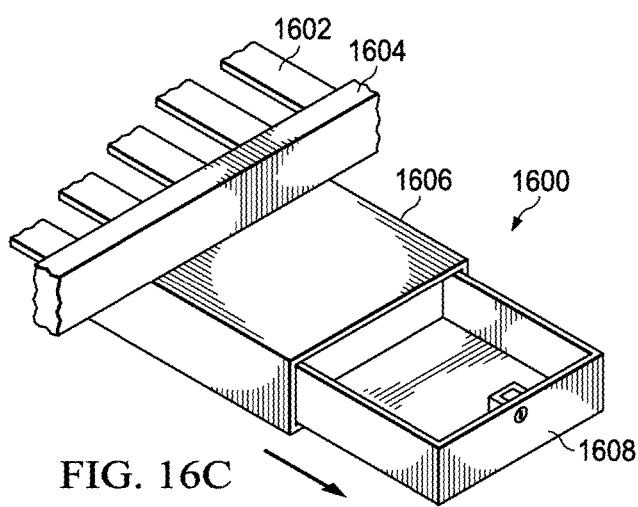

With regard to FIGS. 16A-16C, illustrations of an illustrative sliding lock-box 1600 in three different positions that may be integrated with an outdoor chaise lounge are shown.

In FIG. 16A, the lock-box 1600 is stowed under a seat member 1602 and chair rail or frame 1604 of the outdoor chaise lounge. In FIG. 16B, the lock-box is extended from beneath the seat member 1602, thereby providing for a "table" or shelf 1606 on which a user may place items. In FIG. 16C, a lock-box compartment 1608 may be further extended from beneath the table 1606 portion or cover of the lock-box 1600, thereby enabling a user to access the contents of the lock-box 1600 without having to alter the table 1606. In one embodiment, the lock-box 1600 may be slid out from beneath the seat member 1602 whether or not the user has rented or is using the compartment 1608 to provide the user with convenience of the table 1606. This configuration may also be considered a two-stage drawer.

Figure 17:
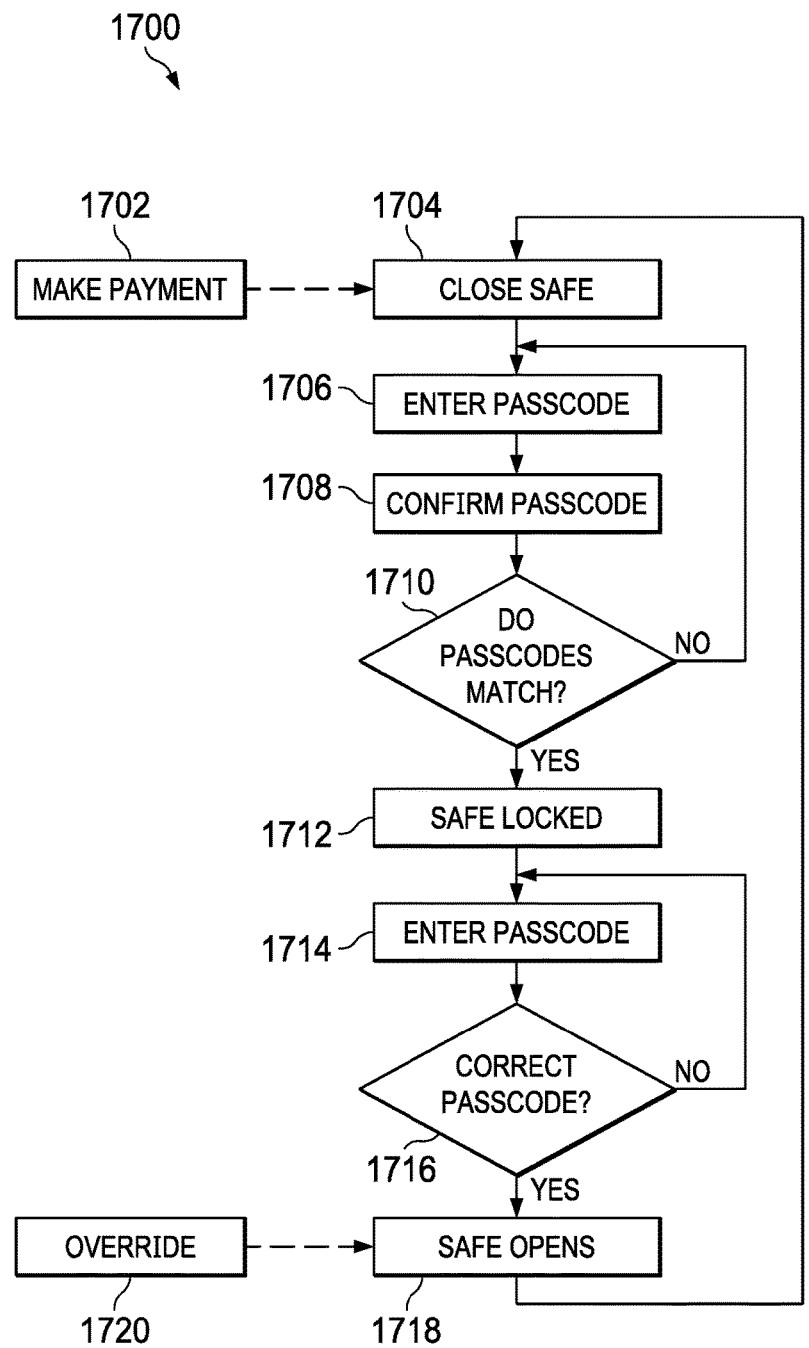
FIG. 17 is a flow diagram of an illustrative process for enabling a user to rent a lock-box configured with an outdoor chaise lounge.

With regard to FIG. 17, a flow diagram of an illustrative process 1700 for enabling a user to rent a lock-box configured with an outdoor chaise lounge is shown. The process 1700 may include making a payment at step 1702. The safe or lock-box may be in a closed position at step 1704, and a passcode or PIN may be created or received at step 1706. At the lock-box or via a remote system, the user may enter a passcode to cause the lock-box to lock. In the event that the user is provided with an RFID bracelet (see FIG. 1B), then the user may place the RFID tag of the bracelet near the lock-box to cause the lock-box to lock. The lock-box or remote system may confirm a passcode provided to the lock-box at step 1708. If the passcode matches at step 1710, the lock-box may be locked at step 1712, otherwise the process may reform to step 1706. To unlock the lock-box, the passcode may be reentered into and received by the lock-box by a user at step 1714. It should be understood that the lock-box may be configured to remain unlocked unless a valid passcode is entered, as determined at step 1716, where the lock-box may be opened at step 1718. In other words, the lock-box may be normally unlock unless controlled by a user to cause the lock-box to lock, thereby reducing the chance that something will unintentionally be locked in the lock-box by someone who does not know the passcode. At step 1720, an override process, such as using a physical key, may be used to unlock and open the lock-box.

Figure 18:
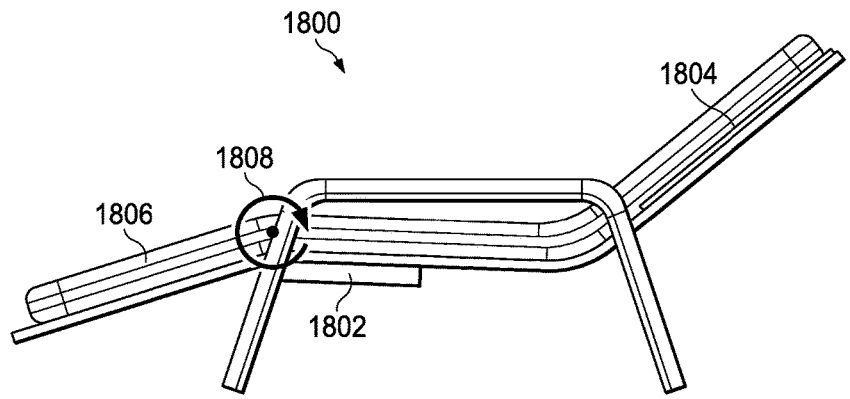
FIG. 18 is an illustration of an illustrative outdoor chaise lounge inclusive of a lock-box.

With regard to FIG. 18, an illustration of an illustrative outdoor chaise lounge 1800 inclusive of a lock-box 1802 is shown. The outdoor chaise lounge 1800 may also include a photovoltaic device 1804, a cushion 1806, and at least one hinge 1808 configured to rotatably position a portion of the outdoor chaise lounge 1800 and the cushion 1806.

In one embodiment, the lock-box 1802 may be about two-inches thick. Other thicknesses are possible depending on the configuration of the outdoor chaise lounge 1800 to which the lock-box 1802 is engaged. The lock-box may 1802 may include a drawer inclusive of a wireless charger for an electronic device such that when the electronic device is placed in the drawer, the electronic device may be charged. In one embodiment, the cushion 1806 may be approximately 3 inches thick. One of skill in the art will appreciate that a variety of thicknesses for the lock-box 1802 and the cushion 1806 are considered. The hinge 1808 may be configured to rotate the portion of the outdoor chaise lounge 1800 and the cushion 1806 such that the lock-box 1802 may be accessible.

Figure 19A:
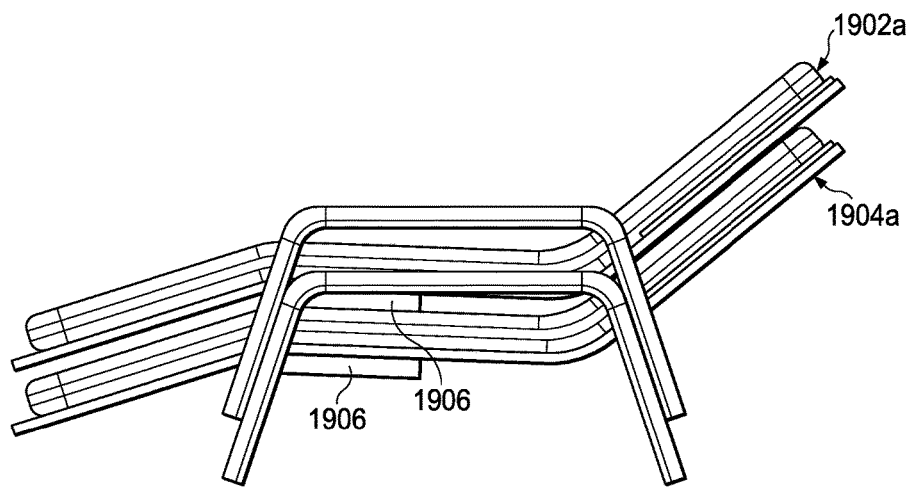
FIGS. 19A-19C are illustrations of an illustrative outdoor chaise lounge that is configured to stack on other outdoor chaise lounges.
Figure 19B:
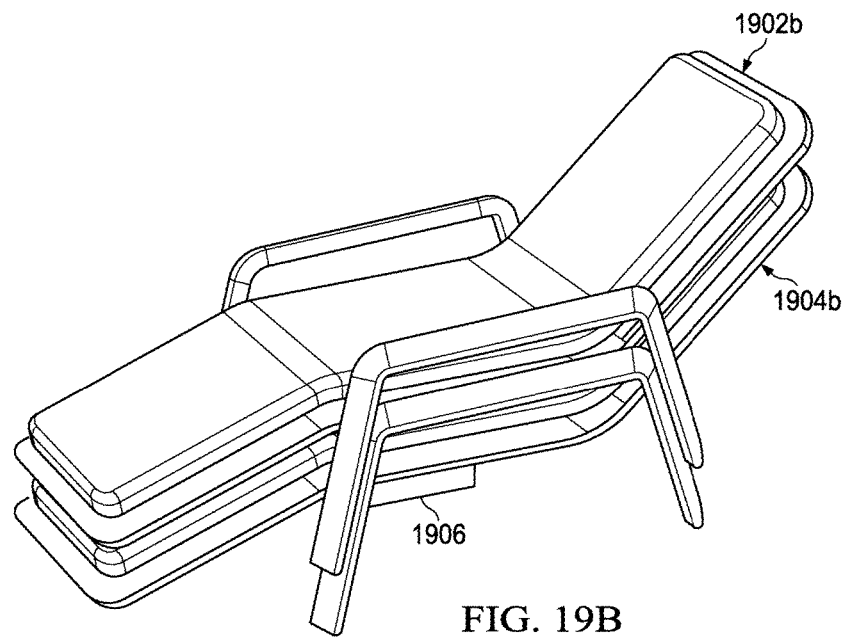
Figure 19C:
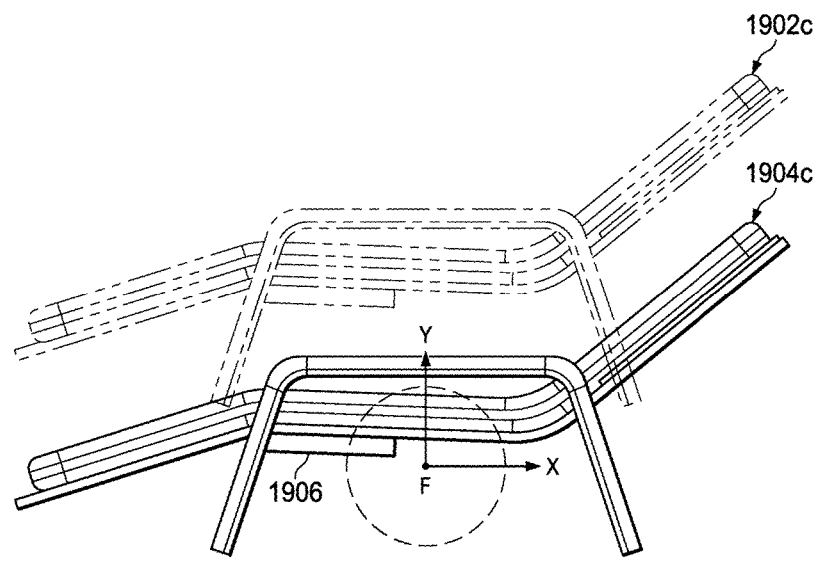

With regard to FIGS. 19A-19C, illustrations of illustrative outdoor chaise lounges 1902a-1902c (collectively 1902) that are configured to stack on other outdoor chaise lounges 1904a-1904c (collectively 1904) are shown. A profile of lock boxes 1906 are such that the outdoor chaise lounges 1902 are able to be stacked on outdoor chaise lounges 1904 without touching or touching, but not damaging or otherwise impacting the ability to stack the outdoor chaise lounges 1902 and 1904.

Figure 20:
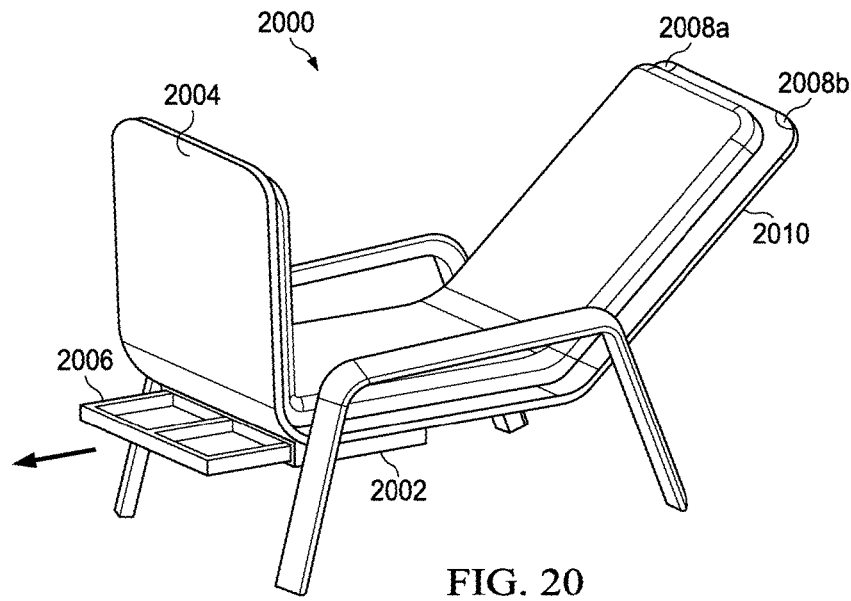
FIG. 20 is an illustration of an illustrative outdoor chaise lounge inclusive of a lock-box.

With regard to FIG. 20, an illustration of an illustrative outdoor chaise lounge 2000 inclusive of a lock-box 2002 is shown. In one embodiment, a bottom or foot portion 2004 of the outdoor chaise lounge 2000 may be rotatably connected such that the bottom portion 2004 may be rotated upwards to allow a user access to the lock-box 2002. A hinge (not shown) to which the bottom portion 2004 attaches may be configured to enable the bottom portion 2004 to remain in an upright position. Alternatively, the bottom portion 2004 may be rotated upwards and may be configured with one or more stop mechanisms (e.g., bar, pins, brace, etc.) that enables the bottom portion 2004 to be positioned in an upwards position (e.g., 30 degrees to 180 degrees) to allow for the user to access the lock-box 2002. The user may open a drawer 2006 of the lock-box 2002 to secure personal items inside the lock-box 2002. After closing the drawer 2006, the bottom portion 2004 may be rotated down to allow the user to access the outdoor chaise lounge 2000. In an embodiment, a safety mechanism may be provided that prevents the bottom portion from pressing against the drawer when extended outwards.

In one embodiment, magnets, clips, hooks, loops and hooks material, or other fastening members may be disposed on a top portion 2010 of the chaise lounge 2000 that a user may use to attach or otherwise prevent a towel with complimentary member(s) (e.g., magnets, eyes, pockets, etc.) from sliding or falling down from the top portion 2010 of the chaise lounge 2000.

Figure 21:
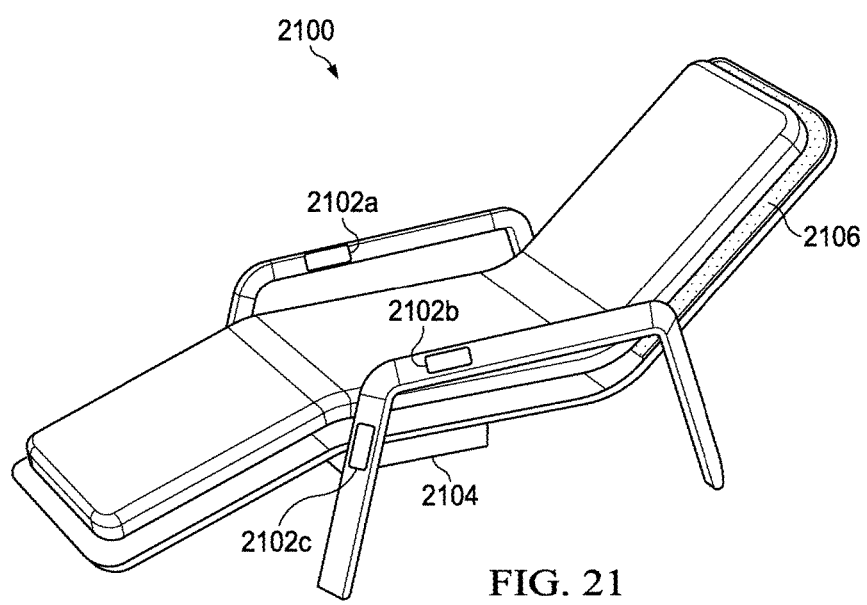
FIG. 21 is an illustration of an illustrative outdoor chaise lounge inclusive of an electronic device configured to be in communication with a communications network of a venue.

With regard to FIG. 21, an illustration of an illustrative outdoor chaise lounge 2100 inclusive of positions in which electronic device(s) 2102a-2102c (collectively 2102) configured to be in communication with a communications network of a venue is shown. The outdoor chaise lounge 2100 may also include a lock-box 2104 and a photovoltaic device 2106.

In on embodiment, the electronic device 2102 may disposed in at least one of a frame and at least one leg coupled to the frame. The electronic device 2102 may be configured to be electrically coupled to an electronic connector, either wired or wireless, disposed in at least one of the frame and leg(s) coupled to the frame. One of skill in the art will appreciate that any of the frame and the legs may be configured to include electronic connectors configured to be electrically coupled to the electronic device 2102. Electrical conductors may be attached to or extend through the frame and/or legs to provide for electrical power and/or signaling to the connectors. The electronic device 2102 may include an electronic paper display, generally known as e-ink. In one embodiment, the electronic paper display may include an approximately 6-inch diagonal screen size. Other dimensions are possible. The frame, leg, or armrest (depending on the location and configuration of the chaise lounge or chair) (individually considered a structural member of the chaise lounge) may be indented to accommodate the electronic device 2102 so that the device 2102 is flush with a top surface of the member to which the device 2102 is secured or otherwise positioned. In an embodiment, a flap or cover (not shown) that is rotatably or otherwise connected to the member may be used to protect the device 2102 from being exposed to the environment (e.g., sun, rain, children, etc.). In one embodiment, the electronic device 2102 may be configured to communicate with another electronic communications device attached to the outdoor chaise lounge 2100. The wireless device of the outdoor chaise lounge 2100 may be configured to communicate signals from the electronic device 2102 to a communications network of a venue. In one embodiment, the electronic device 2102 may be configured to communicate with the communications network of the venue directly or indirectly.

The electronic device 2102 may be configured to communicate signals indicative of food and/or drink orders, a request for a venue server, and a number of other messages the user may communicate to the venue (e.g., chair number, general position of the chair, image of a user of the chair, or any other information). One of skill in the art will appreciate that a number of messages may be communicated from the user to the venue. Any variety of communications protocols, such as WiFi®, Bluetooth®, or otherwise may be utilized. In one embodiment, the electronic device 2102 may be configured to have a low power sleep mode when the user is not active. In one embodiment, the electronic connector may include a inductive, wireless, or other connector that enables charging of the electronic device 2102. One illustrative connector is a MagiSnap™ connector.

In one embodiment, the lock-box 2104 may include a battery, such as a 6,000 mAH Lithium Ion Battery. Any other sized battery may be utilized. The battery may be rechargeable, as previously described, through use of a photovoltaic or other device (e.g., wireless charger). The lock-box 2104 may be configured with a circuit to prevent over and/or under charging. In one embodiment, the lock-box 2104 may be further configured to prevent overheating. In one embodiment, the photovoltaic device 2106 may include an approximately 60 square inch photovoltaic panel.

In one embodiment, the outdoor chaise lounge 2100 may include a battery for the electronic device 2102, such as a 1,000 mAH battery. In one embodiment, the battery for the electronic device 2102 may be housed in the lock-box 2104. In one embodiment, the lock-box 2104 may include an additional battery, such as a 500 mAH battery for powering the lock-box 2104. The lock-box 2104 may also include a wireless charger for charging electronic devices and at least one USB port, such as a USB type A port. The outdoor chaise lounge 2100 may also include electrical conductors in at least one of the frame and leg(s) of the plurality of legs. The electrical conductors may be electrically coupled to the electronic connectors.

Figure 22:
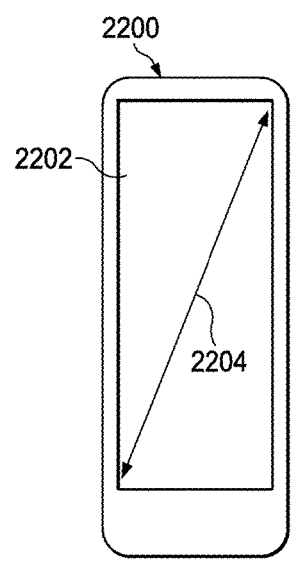
FIG. 22 is an illustration of an illustrative electronic device configured to communicate with a communications network of a venue.

With regard to FIG. 22, an illustration of an illustrative electronic device 2200 configured to communicate with a communications network of a venue is shown. The electronic device 2200 may include an electronic paper display 2202. In one embodiment, the electronic paper display 2202 may include an approximately 6-inch diagonal screen size 2204.

The electronic device 2200 may be configured to enable a user to order food and/or drinks, manage a chaise lounge (e.g., cause a light to be illuminated to notify other users that the chaise lounge is occupied, notify a hotel operator of the location of the user, etc.), communicate a message to venue security, communicate remaining battery to a user, communicate a message to an attendant of the venue, and end a user session of a chaise lounge associated with the electronic device 2200.

In one embodiment, the electronic paper display may include an E-Ink 6-inch screen. In one embodiment, the electronic device 2200 may be configured to communicate to Micros Hotel Software. The display of the electronic device 2202 may be a touch-enabled display.

Figure 23A:
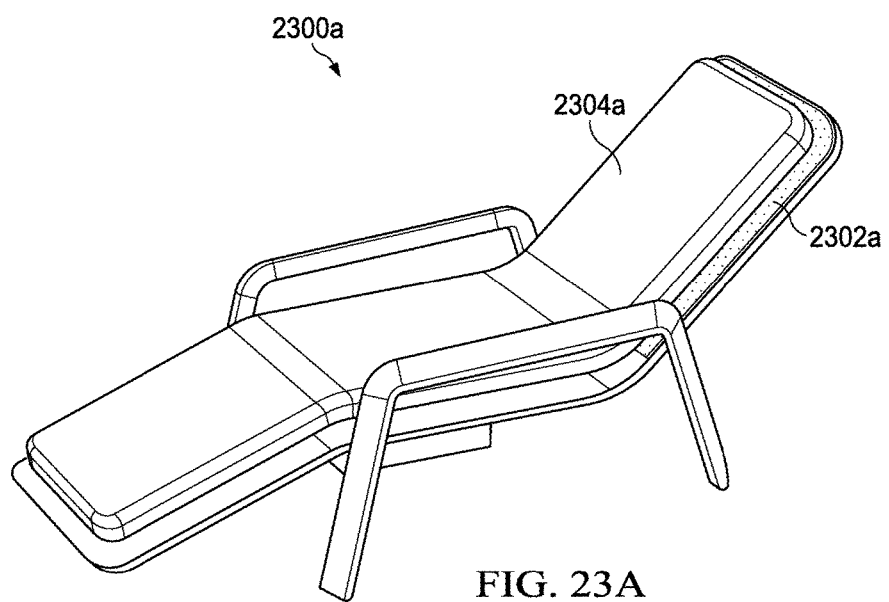
FIGS. 23A and 23B are illustrations of an illustrative outdoor chaise lounge inclusive of a photovoltaic device and a cushion disposed on the photovoltaic device.
Figure 23B:
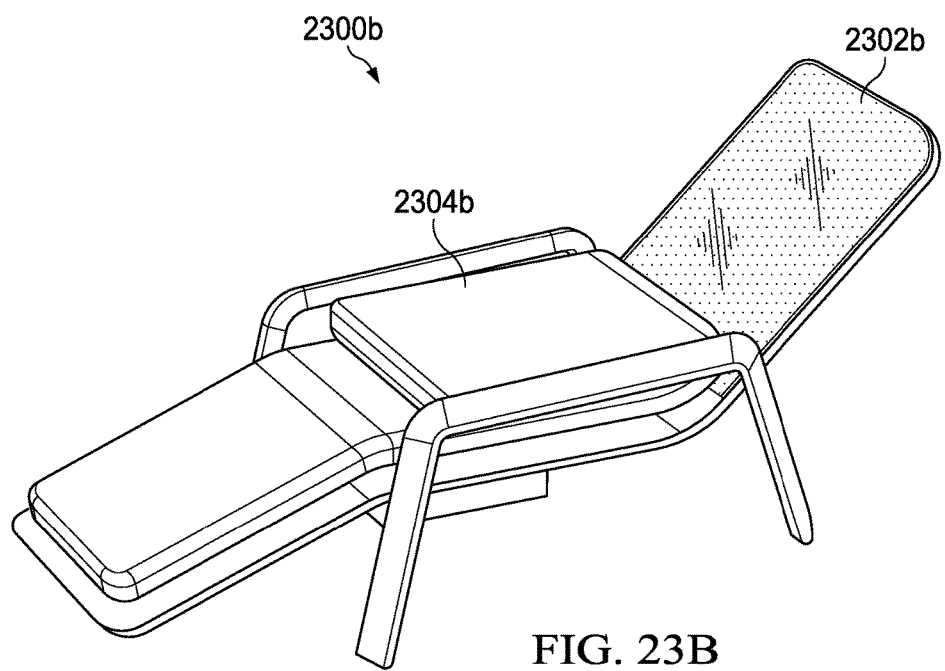

With regard to FIGS. 23A and 23B, illustrations of an illustrative outdoor chaise lounge 2300a, 2300b (collectively 2300) inclusive of a photovoltaic device 2302a, 2302b (collectively 2302) and a cushion 2304a, 2304b (collectively 2304) disposed on the photovoltaic device 2303 are shown. In one embodiment, the outdoor chaise lounge 2300a may represent an occupied chair. The outdoor chaise lounge 2300a may include the cushion 2304a in an up position. The up position may be configured to allow for a trickle charge from the photovoltaic device 2302a to electronic devices disposed in and/or in electrical communication with the outdoor chaise lounge 2300a.

In one embodiment, the outdoor chaise lounge 2300b may represent an unoccupied chair. The outdoor chaise lounge 2300b may include the cushion 2304b in a down position. The down position may expose a substantially large portion of the photovoltaic device 2302b such that fast charging of electronic devices disposed in and/or in electrical communication with a lock-box of the outdoor chaise lounge 2300b is enabled.

In one embodiment, an actuator, such as a powered motor or other electromechanical, hydraulic, or pneumatic mechanism (e.g., piston shaft), may be configured to automatically rotate the top or head portion of the chair to cause the cushion 2304b to fold down, thereby exposing the entirety of the photovoltaic device 2302b. In an embodiment, a sensor, such as a pressure or weight sensor, may be disposed on a seat or leg portion, thereby sensing whether the chair is currently occupied, and enabling a driver of the powered motor or other mechanism. In an embodiment, the automatic sensing may determine whether the battery has a low charge prior to automatically rotating the top portion of the seat, thereby preventing the top portion from constantly automatically rotating.

Figure 24A:
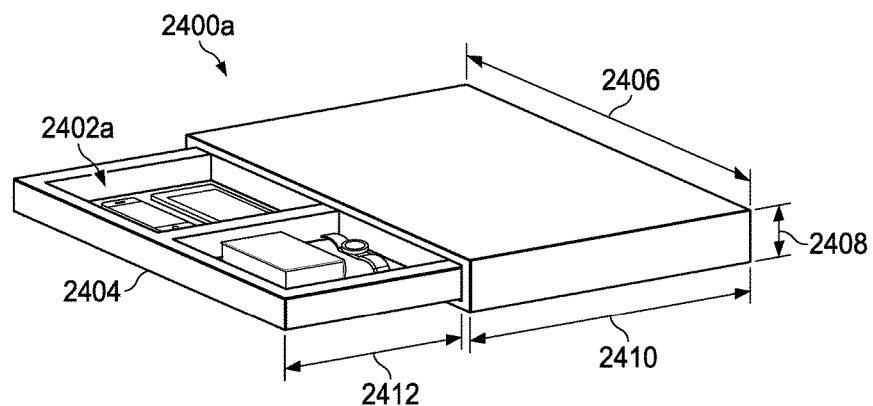
FIGS. 24A and 24B are illustrations of an illustrative lock-box inclusive of a slideable drawer.
Figure 24B:
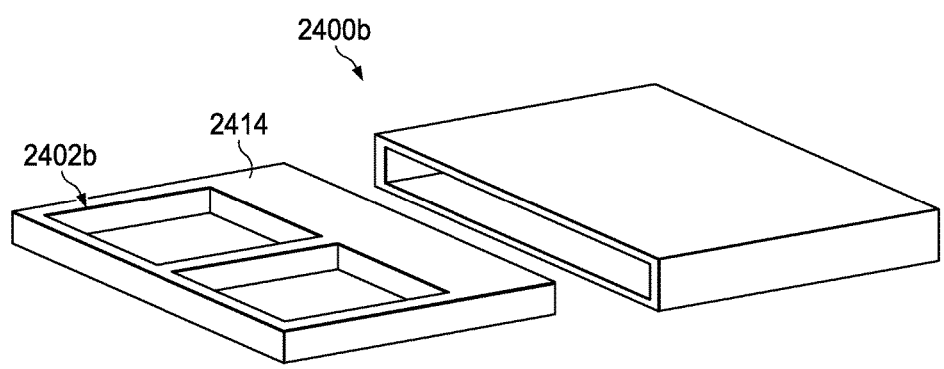

With regard to FIGS. 24A and 24B, illustrations of an illustrative lock-box 2400a, 2400b (collectively 2400) inclusive of a slideable drawer 2402a, 2402b (collectively 2402) are shown. The drawer 2402 may include a wireless charging pad 2404 for wirelessly charging electronic devices. The pad 2404 may be conductive or use any other wireless charging technology, as understood in the art.

In one embodiment, the lock-box 2400 may include a width 2406 of approximately 18 inches, a height 2408 of approximately two-inches, and a depth 2410 of approximately 12.5 inches. In one embodiment, the drawer 2402 may include a depth 2412 of approximately 9 inches. One of skill in the art will appreciate that a number of dimensions and/or combinations of dimensions will operate substantially similar as the dimensions described herein. In one embodiment, batteries and/or other electronic components may be housed in a rear portion 2414 of the drawer 2402.

Although the lock-boxes described herein have been applied to an outdoor chaise lounge, it should be understood that the lock-box may be applied to other items or fixtures in accordance with the principles of the present invention. For example, tables, chairs, and other devices may also have lock-boxes applied thereto for rental or otherwise.

The previous description is of a preferred embodiment for implementing the invention, and the scope of the invention should not necessarily be limited by this description. The scope of the present invention is instead defined by the following claims.

What is claimed:

1. An outdoor chaise lounge, comprising:
   a frame;
   a plurality of legs coupled to and extending below said frame to support said frame;
   a seat member coupled to said frame to enable a user to sit or lay on said seat member;

a lock-box fixedly supported by said frame that enables a user of the outdoor chaise lounge to store and lock items therein, said lock-box including a lock-box door inclusive of a user interface that enables a user to lock and unlock said lock-box;

at least one electrical connector disposed on a member of the chaise lounge, said at least one electrical connector configured to electrically couple to an electronic device, the electronic device configured to be electrically communicative with a communications network of a venue;

a power source;

at least one other electronic device in electrical communication with said power source; and a second user interface in electrical communication with (i) said power source and (ii) the at least one other electronic device, wherein the at least one other electronic device includes a signal generator configured to generate an alert signal to alert an attendant proximate the outdoor chaise lounge that the user has a request in response to the user activating the signal generator via said second user interface.

2. The outdoor chaise lounge according to claim 1, further comprising:
a photovoltaic device configured to convert light energy into electricity; and
wherein said power source is a rechargeable battery in electrical communication with said photovoltaic device.

3. The outdoor chaise lounge according to claim 2, wherein said power source is in electrical communication with said photovoltaic device via a wireless connector.

4. The outdoor chaise lounge according to claim 2, wherein said photovoltaic device has a surface that extends behind and outside of a cushion configured for said seat member.

5. The outdoor chaise lounge according to claim 2, wherein said photovoltaic device is configured to be coupled to at least a portion of said seat member.

6. The outdoor chaise lounge according to claim 5, further comprising a cushion disposed on said seat member having a first portion and a second portion, the first portion having an up position and a down position such that when the first portion is in the down position, the photovoltaic device is fully exposed to receive light energy.

7. The outdoor chaise lounge according to claim 6, further comprising:
a sensor configured to sense if a user is on the chaise lounge; and
an actuator configured to rotatably move the first portion of said cushion relative to the second portion of said cushion in response to said sensor sensing that the user is not on the chaise lounge.

8. The outdoor chaise lounge according to claim 1, wherein said lock-box is fixedly attached to said frame.

9. The outdoor chaise lounge according to claim 8, further comprising:
a bracket configured to mount said lock-box to said frame;
fastening members configured to fixedly secure said lock-box to said frame; and
a cover member configured to prevent direct access to said fastening members, wherein said cover member includes at least one cover fastening member being different from said fastening members.

10. The outdoor chaise lounge according to claim 1, further comprising a power adapter outlet in electrical communication with said power source, and configured to enable a power adapter cord to be electrically connected thereto, thereby enabling the user to charge a rechargeable battery of an electronic device.

11. The outdoor chaise lounge according to claim 1, wherein the at least one other electronic device includes an illumination device supported by said frame, wherein said lock-box further includes a circuit configured (i) to sense that said lock-box is in a lock state and cause the illumination device to illuminate and (ii) to sense that said lock-box is in an unlocked state and cause the illumination device to turn off.

12. The outdoor chaise according to claim 1, wherein said seat member includes a first section and a second section, the first section being rotatable relative to said frame, wherein said lock-box includes an electronic lock mechanism that is configured to enable the user to set the first section to a particular rotatable position in which the user has to set the first section prior to the electronic lock mechanism to be able to unlock said lock-box.

13. The outdoor chaise lounge according to claim 1, further comprising hardware configured to fixedly secure said lock-box to the outdoor chaise lounge.

14. The outdoor chaise lounge according to claim 1, wherein said door member is a drawer and the open position is configured to be the drawer pulled out from said lock-box.

15. The outdoor chaise lounge according to claim 1, wherein at least one of said frame and at least one of said plurality of legs includes an electrical conductor, the electrical conductor electrically coupled to the at least one electrical connector.

16. The outdoor chaise lounge according to claim 1, wherein said lock-box has a height of about two-inches.

17. The outdoor chaise lounge according to claim 1, wherein the electronic device includes an electronic paper display.

18. An outdoor chaise lounge, comprising:
a frame;
a plurality of legs coupled to and extending below said frame to support said frame;
a seat member coupled to said frame to enable a user to sit or lay on said seat member;
a lock-box fixedly supported by said frame that enables a user of the outdoor chaise lounge to store and lock items therein, said lock-box including a lock-box door inclusive of a user interface that enables a user to lock and unlock said lock-box;
a power source; and
at least one electrical connector disposed on a member of the chaise lounge, said at least one electrical connector configured to electrically couple to an electronic device, the electronic device configured to be electrically communicative with a communications network of a venue, at least one of said frame and at least one of said plurality of legs includes an electrical conductor, the electrical conductor electrically coupled to the at least one electrical connector.

19. The outdoor chaise lounge according to claim 18, further comprising:
at least one other electronic device in electrical communication with said power source; and
a second user interface in electrical communication with (i) said power source and (ii) the at least one other electronic device, wherein the at least one other electronic device includes a signal generator configured to generate an alert signal to alert an attendant proximate the outdoor chaise lounge that the user has a request in response to the user activating the signal generator via said second user interface.

20. The outdoor chaise lounge according to claim 19, wherein said power source is a rechargeable battery.

\* \* \* \* \*